(12) United States Patent
Jung et al.

(10) Patent No.: US 9,997,648 B2
(45) Date of Patent: Jun. 12, 2018

(54) COMPOSITION FOR SOLAR CELL ELECTRODE AND ELECTRODE PREPARED USING THE SAME

(71) Applicant: SAMSUNG SDI CO., LTD., Yongin-si, Gyeonggi-do (KR)

(72) Inventors: Seok Hyun Jung, Uiwang-si (KR); Dong Suk Kim, Uiwang-si (KR); JuHee Kim, Uiwang-si (KR); Min Su Park, Uiwang-si (KR); Min Jae Kim, Uiwang-si (KR); SeakCheol Kim, Uiwang-si (KR); Sang Hyun Yang, Uiwang-si (KR); Je Il Lee, Uiwang-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 221 days.

(21) Appl. No.: 14/964,705

(22) Filed: Dec. 10, 2015

(65) Prior Publication Data
US 2016/0190360 A1 Jun. 30, 2016

(30) Foreign Application Priority Data
Dec. 30, 2014 (KR) .......... 10-2014-0194317

(51) Int. Cl.
*H01B 1/22* (2006.01)
*H01L 35/00* (2006.01)
*H01L 31/0224* (2006.01)

(52) U.S. Cl.
CPC ....... *H01L 31/022425* (2013.01); *H01B 1/22* (2013.01); *Y02E 10/50* (2013.01)

(58) Field of Classification Search
CPC ... H01B 1/00; H01B 1/16; H01B 1/22; C09D 5/24; H01L 31/0224; H01L 35/14; H01L 35/24
See application file for complete search history.

(56) References Cited

U.S. PATENT DOCUMENTS

| | | | |
|---|---|---|---|
| 7,488,434 B2* | 2/2009 | Kuo | H01B 1/22 241/23 |
| 8,470,723 B2 | 6/2013 | Naito et al. | |
| 8,623,500 B2* | 1/2014 | Ogawa | C09C 1/62 428/323 |
| 8,986,575 B2* | 3/2015 | Akiba | C09D 11/10 106/31.92 |

(Continued)

FOREIGN PATENT DOCUMENTS

| | | |
|---|---|---|
| CN | 103052605 A | 4/2013 |
| CN | 103155159 A | 6/2013 |

(Continued)

OTHER PUBLICATIONS

Power Chemical Corp. SiSiB La0333 Additive data sheet 2008 (Year: 2008).*

(Continued)

*Primary Examiner* — Mark Kopec
(74) *Attorney, Agent, or Firm* — Lee & Morse, P.C.

(57) ABSTRACT

A composition for solar cell electrodes and a solar cell electrode, the composition including silver powder; glass frit that contains tellurium, the glass frit having a glass transition temperature (Tg) of about 150° C. to about 300° C.; an organosilane compound; and an organic vehicle.

12 Claims, 1 Drawing Sheet

(56) References Cited

U.S. PATENT DOCUMENTS

| | | | |
|---|---|---|---|
| 2009/0250106 A1 | 10/2009 | Hayashi et al. | |
| 2010/0180934 A1 | 7/2010 | Naito et al. | |
| 2013/0167923 A1 | 7/2013 | Nakamura et al. | |
| 2014/0319430 A1* | 10/2014 | Chae | H01L 31/022425 252/514 |
| 2015/0194546 A1* | 7/2015 | Sun | H01B 1/22 136/256 |
| 2015/0364622 A1* | 12/2015 | Jung | H01L 31/022425 252/514 |
| 2017/0092788 A1* | 3/2017 | Song | H01L 31/022425 |

FOREIGN PATENT DOCUMENTS

| | | |
|---|---|---|
| CN | 103310871 A | 9/2013 |
| CN | 103951262 A | 7/2014 |
| CN | 104078092 A | 10/2014 |
| JP | 2005-504409 A | 2/2005 |
| KR | 10-2010-0075661 A | 7/2010 |
| KR | 10-2013-0079554 A | 7/2013 |
| TW | 201035260 A1 | 10/2010 |

OTHER PUBLICATIONS

TEGO journal Evonik Slip and Low Additives data sheet 2014 (Year: 2014).*
Korean Office Action dated Jul. 22. 2016 in Corresponding Korean Patent Application No. 10-2014-0194317, (No English language translation provided).
Chinese Office Action dated Nov. 11, 2016 in corresponding Chinese Patent Application No. 201510993613.4, (No English language translation provided).
Office Action dated Jan. 13, 2017 in the corresponding Taiwanese Patent Application No. 104144128, (No English language translation provided).
Chinese Office Action dated Jun. 29, 2017 in the corresponding Chinese Patent Application No. 201510993613.4, (No English language translation provided).
Provisional double patenting rejection over claims of the above-identified application; USPTO Office action dated Sep. 19, 2017, in U.S. Appl. No. 15/592,345.
Taiwanese Office Action dated Jul. 28, 2017 in the corresponding Taiwanese Patent Application No. 104144128, (No English language translation provided).

* cited by examiner

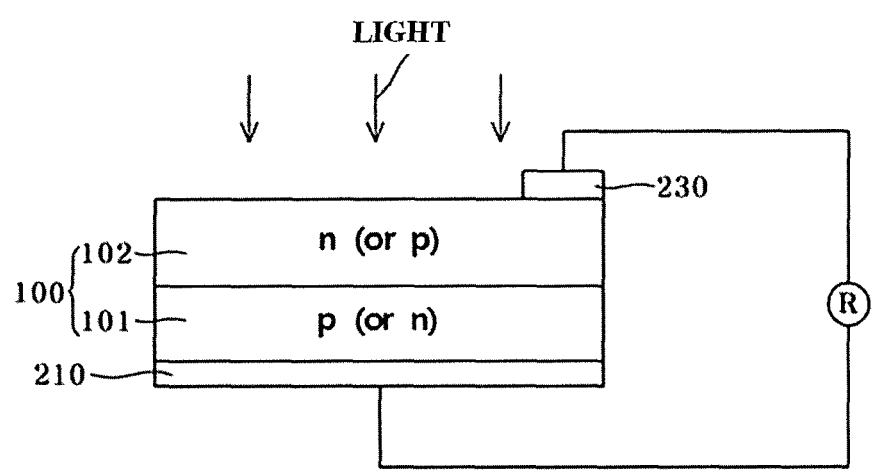

COMPOSITION FOR SOLAR CELL ELECTRODE AND ELECTRODE PREPARED USING THE SAME

CROSS-REFERENCE TO RELATED APPLICATION

Korean Patent Application No. 10-2014-0194317, filed on Dec. 30, 2014, in the Korean Intellectual Property Office, and entitled: "Composition for Solar Cell Electrode and Electrode Prepared Using the Same," is incorporated by reference herein in its entirety.

BACKGROUND

1. Field

Embodiments relate to a composition for solar cell electrodes and an electrode prepared using the same.

2. Description of Related Art

Solar cells generate electric energy using the photovoltaic effect of a p-n junction, which converts photons of light, e.g., sunlight, into electricity. In the solar cell, front and rear electrodes may be formed on upper and lower surfaces of a semiconductor wafer or substrate with the p-n junction, respectively. Then, the photovoltaic effect of the p-n junction may be induced by light, e.g., sunlight, entering the semiconductor wafer and electrons generated by the photovoltaic effect of the p-n junction may provide electric current to the outside through the electrodes. The electrodes of the solar cell may be formed on the wafer by applying, patterning, and baking a composition for electrodes.

SUMMARY

Embodiments are directed to a composition for solar cell electrodes and an electrode prepared using the same.

The embodiments may be realized by providing a composition for solar cell electrodes, the composition including silver powder; glass frit that contains tellurium, the glass frit having a glass transition temperature (Tg) of about 150° C. to about 300° C.; an organosilane compound; and an organic vehicle.

The composition may include about 60 wt % to about 95 wt % of the silver powder; about 0.1 wt % to about 20 wt % of the glass frit; about 0.01 wt % to about 3 wt % of the organosilane compound; and about 1 wt % to about 30 wt % of the organic vehicle.

The glass frit may be a Bi—Te—O-containing glass frit and contains about 50 mole % to about 90 mole % of elemental tellurium (Te).

In the Bi—Te—O-containing glass frit, a mole ratio of bismuth (Bi) to tellurium (Te) may be about 1:1.5 to about 1:3.5.

The Bi—Te—O-containing glass frit may further include lithium (Li), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), or aluminum (Al).

The glass frit may contain about 5 mole % to about 20 mole % of elemental bismuth (Bi).

The glass frit may be a lead-free glass frit.

The organosilane compound may include a siloxane compound represented by the following Formula 1:

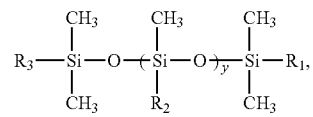

wherein, in Formula 1, $R_1$ to $R_3$ may each independently be a $C_1$ to $C_6$ alkyl group, an ether group, an amino group, a hydroxyl group, a fluoroalkyl group, a phenyl group, an epoxy group, or a carboxyl group, and y may be an integer from 0 to 3,000.

The glass fit and the organosilane compound may be included in the composition in a weight ratio of about 1:0.005 to about 1:30.

The glass frit may have an average particle diameter (D50) of about 0.1 μm to about 10 μm.

The composition may further include a thixotropic agent, a viscosity stabilizer, an anti-foaming agent, a pigment, a UV stabilizer, an antioxidant, or a coupling agent.

The embodiments may be realized by providing a solar cell electrode prepared from the composition for solar cell electrodes according to an embodiment.

The solar cell electrode may have an aspect ratio of about 0.1 to about 0.3, as represented by the following equation:

Aspect ratio=$D1/L3$ wherein D1 is a thickness in μm of the electrode after baking and L3 is a line width in μm of the electrode after baking.

BRIEF DESCRIPTION OF DRAWING

Features will be apparent to those of skill in the art by describing in detail exemplary embodiments with reference to the attached drawing in which:

FIG. 1 illustrates a schematic view of a solar cell according to one embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. It will also be understood that when a layer or element is referred to as being "on" another layer or element, it can be directly on the other layer or element, or intervening layers may also be present. Like reference numerals refer to like elements throughout.

As used herein, the term "aspect ratio of an electrode" refers to a value obtained by dividing a thickness of an electrode after baking by a line width of the electrode after baking. For example, an aspect ratio of an electrode may be given or calculated by the following equation.

Aspect ratio=$D1/L3$

In the equation D1 is a thickness (in μm) of the electrode after baking and L3 is a line width (in pin) of the electrode after baking.

Composition for Solar Cell Electrode

A composition for solar cell electrodes according to an embodiment may include, e.g., silver (Ag) powder; glass frit; an organosilane compound; and an organic vehicle. Each component of the composition for solar cell electrodes according to the embodiment will be described in more detail.

(A) Silver Powder

The composition for solar cell electrodes according an embodiment may include, e.g., silver (Ag) powder as a conductive powder. The silver powder may have, e.g., a nanometer or a micrometer-scale particle size. For example, the silver powder may have a particle size of dozens to several hundred nanometers, or several to dozens of micrometers. In an implementation, the silver powder may be a mixture of two or more types of silver powders having different particle sizes.

The silver powder may have a, e.g., spherical, flake, or amorphous shape.

In an implementation, the silver powder may have an average particle diameter (D50) of about 0.1 µm to about 10 µm, e.g., 0.5 µm to 5 µm. Within this range, the composition may provide low contact resistance and low line resistance.

The average particle diameter may be measured using a particle size analyzer Model 1064D (CILAS Co., Ltd.) after dispersing the conductive powder in isopropyl alcohol (IPA) at 25° C. for 3 minutes via ultrasonication. Within this average particle diameter range, the composition may provide low contact resistance and low line resistance.

The silver powder may be present in the composition in an amount of, e.g., about 60 wt % to about 95 wt %, based on a total weight of the composition. Within this range, the silver powder may help reduce resistance, thereby enhancing conversion efficiency. In addition, the composition may be easily formed into a paste by maintaining amount of the organic vehicle at a proper level. For example, the silver powder may be present in an amount of about 70 wt % to about 90 wt %, based on the total weight of the composition. Within this range, the composition may provide further enhanced conversion efficiency and be more easily formed into a paste.

(B) Glass Frit

The glass fit may serve to enhance adhesion between the conductive powder and a wafer and to form silver crystal grains in an emitter region by etching an anti-reflection film and melting the silver powder so as to reduce contact resistance during a baking process of the composition for solar cell electrodes. Further, during the baking process, the glass frit may soften and decrease the baking temperature.

When the area of the solar cell is increased in order to improve solar cell efficiency, solar cell contact resistance may increase. Thus, it may be desirable to minimize both serial resistance and influence on the p-n junction. In addition, as a baking temperature varies within a broad range with increasing use of various wafers having different sheet resistances, it may be desirable that the glass frit secure sufficient thermal stability to withstand a wide range of baking temperatures.

In an implementation, the glass frit may be or include a Bi—Te—O glass frit, e.g., a Bi—Te—O-based glass frit or Bi—Te—O-containing glass frit. As used herein, the Bi—Te—O-containing or Bi—Te—O-based glass frit may originate or be prepared from a metal oxide including bismuth (Bi) oxide and tellurium (Te) oxide, and may refer to a glass frit containing elemental bismuth (Bi) and elemental tellurium (Te).

By way of example, the Bi—Te—O-containing glass fit may have a glass transition temperature (Tg) of about 150° C. to about 300° C. Within this glass transition temperature range, the glass frit may exhibit fluidity and thus may etch an anti-reflection film, thereby reducing contact resistance.

The Bi—Te—O-containing glass fit may contain, e.g., about 50 mole % to about 90 mole % of elemental tellurium (Te) and about 5 mole % to about 20 mole % of elemental bismuth (Bi). Within this range, the composition may facilitate formation of an electrode having reduced serial resistance (Rs) and increased open circuit voltage (Voc), thereby providing enhanced conversion efficiency.

In the Bi—Te—O-containing glass frit, a mole ratio of bismuth (Bi) to tellurium (Te) may be, e.g., about 1:1.5 to about 1:3.5. Within this range, the glass frit may help reduce serial resistance (Rs) and increase open circuit voltage (Voc) of an electrode, thereby further enhancing conversion efficiency.

In an implementation, the glass frit may further include, e.g., lithium (Li), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), and/or aluminum (Al).

In an implementation, the glass frit may be, e.g., a Bi—Te—W—O glass frit. In the Bi—Te—W—O glass frit, a mole ratio of bismuth (Bi) to tungsten (W) may be, e.g., about 1:0.004 to about 1:0.5. Within this range, an electrode prepared from the composition may have reduced serial resistance (Rs) and increased open circuit voltage (Voc), thereby providing further enhanced conversion efficiency.

In an implementation, the glass fit may be, e.g., a Bi—Te—W—Zn—O glass frit. In the Bi—Te—W—Zn—O glass frit, a mole ratio of bismuth (Bi) to zinc (Zn) may be, e.g., about 1:0.1 to about 1:0.5. Within this range, an electrode prepared from the composition may have reduced serial resistance (Rs) and increased open circuit voltage (Voc), thereby providing further enhanced conversion efficiency.

In an implementation, the glass frit may be, e.g., a Bi—Te—W—Zn—Li—O glass frit. In the Bi—Te—W—Zn—Li—O glass frit, a mole ratio of bismuth (Bi) to lithium (Li) may be, e.g., about 1:0.1 to about 1:0.3. Within this range, an electrode prepared from the composition may have reduced serial resistance (Rs) and increased open circuit voltage (Voc), thereby providing further enhanced conversion efficiency.

In an implementation, the content of each component, e.g., metal component, included in the glass fit may be measured by Inductively Coupled Plasma-Optical Emission Spectrometry (ICP-OES).

The glass frit may be prepared from oxides, e.g., metal oxides, as set forth above by a suitable method. For example, the oxides may be mixed in a predetermined ratio. Mixing may be carried out using, e.g., a ball mill or a planetary mill. The mixed composition may be, e.g., melted at 800° C. to 1,300° C., followed by quenching to 25° C. The obtained resultant may be, e.g., subjected to pulverization using a disk mill, a planetary mill, or the like, thereby obtaining glass frit.

The glass frit may have an average particle diameter (D50) of, e.g., about 0.1 µm to about 10 µm, and may have a spherical or amorphous shape. Within this average particle diameter range, the glass frit may advantageously help increase conductivity of an electrode while reducing contact resistance.

In an implementation, the glass frit may be present in the composition in an amount of about 0.1 wt % to about 20 wt %, e.g., about 0.5 wt % to about 10 wt %, based on the total weight of the composition. Within this range, it is possible to secure p-n junction stability given varying sheet resistance while minimizing serial resistance so as to help improve solar cell efficiency.

(C) Organosilane Compound

The organosilane compound may be included to help control line width in printing the composition for solar cell electrodes so as to realize fine patterns having high aspect ratio.

In an implementation, the organosilane compound may include, e.g., polydimethylsiloxane, hexamethyldisiloxane, or a mixture thereof. For example, the organosilane compound may be represented by the following Formula 1.

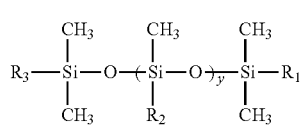

(1)

In Formula 1, $R_1$ to $R_3$ may each independently be, e.g., a $C_1$ to $C_6$ alkyl group, an ether group, an amino group, a hydroxyl group, a fluoroalkyl group, a phenyl group, an epoxy group, or a carboxyl group, and y may be, e.g., an integer of 0 to 3,000.

The alkyl group may be an alkyl group substituted with at least one halogen (e.g., fluorine, bromine, chlorine, and/or iodine)

In an implementation, the organosilane compound may be present in the composition in an amount of about 0.01 wt % to about 3 wt %, e.g., about 0.01 wt % to about 0.1 wt %, based on the total weight of the composition. Within this range, the composition may exhibit excellent printability and may facilitate realization of fine patterns having high aspect ratio.

In an implementation, a weight ratio of the glass frit to the organosilane compound may be, e.g., about 1:0.005 to about 1:30. For example, a weight ratio of the glass frit to the organosilane compound may be 1:0.01 to 1:10, 1:0.01 to 1:5, 1:0.01 to 1:1, or 1:0.02 to 1:0.04. Within this range, it is possible to help secure p-n junction stability given varying sheet resistance while realizing high aspect ratio so as to help improve solar cell efficiency.

(D) Organic Vehicle

The organic vehicle may impart suitable viscosity and rheological characteristics for printing to the composition for solar cell electrodes through mechanical mixing with the inorganic component of the composition.

The organic vehicle may include a suitable organic vehicle used in a composition for solar cell electrodes, e.g., a binder resin, a solvent, or the like.

The binder resin may include, e.g., acrylate resins or cellulose resins. In an implementation, ethyl cellulose may be used as the binder resin. In an implementation, the binder resin may include, e.g., ethyl hydroxyethyl cellulose, nitrocellulose, blends of ethyl cellulose and phenol resins, alkyd, phenol, acrylate ester, xylene, polybutene, polyester, urea, melamine, vinyl acetate resins, wood rosin, polymethacrylates of alcohols, or the like.

The solvent may include, e.g., hexane, toluene, ethyl cellosolve, cyclohexanone, butyl cellosolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzylalcohol, γ-butyrolactone, ethyl lactate, or the like. The solvent may be used alone or in combination thereof.

The organic vehicle may be present in an amount of, e.g., about 1 wt % to about 30 wt %, based on the total weight of the composition. Within this range, the organic vehicle may provide sufficient adhesive strength and excellent printability to the composition.

(E) Additive

In an implementation, the composition for solar cell electrodes may further a suitable additive to, e.g., enhance fluidity and process properties and stability, as needed or desired. The additive may include, e.g., a dispersant, a thixotropic agent, a plasticizer, a viscosity stabilizer, an anti-foaming agent, a pigment, a UV stabilizer, an antioxidant, a coupling agent, or the like. These additives may be used alone or as mixtures thereof. The additive may be present in an amount of, e.g., about 0.1 wt % to about 5 wt %, based on the total weight of the composition. In an implementation, the content of the additive may be changed, as desired.

Solar Cell Electrode and Solar Cell Including the Same

An embodiment may provide an electrode formed from the composition for solar cell electrodes and a solar cell including the same.

FIG. 1 illustrates a schematic view of a solar cell according to an embodiment. Referring to FIG. 1, a solar cell according to an embodiment may include a substrate 100, a front electrode 230 on a front surface of the substrate 100, and a rear electrode 210 on a rear surface of the substrate 100.

As used herein, the substrate 100 may be a substrate wherein one surface of a p-type semiconductor substrate 101 is doped with an n-type dopant to form an n-type emitter 102, thereby providing a p-n junction, or a substrate wherein one surface of an n-type semiconductor substrate 101 is doped with a p-type dopant to form a p-type emitter 102, thereby providing a p-n junction.

For example, a semiconductor substrate 101 may have a front surface (receiving incident light) and a rear surface (opposite the front surface), and may be formed of a monocrystalline or polycrystalline silicon semiconductor or a compound semiconductor. When a crystalline silicon semiconductor is used, the substrate may be a silicon wafer. As the semiconductor substrate 101, a p-type substrate doped with a p-type dopant may be used. In an implementation, an n-type substrate doped with an n-type dopant may be used as the semiconductor substrate. Here, the p-type dopant may be a material including, e.g., a group III element such as boron (B), aluminum (Al) or gallium (Ga), and the n-type dopant may be a material including, e.g., a group V element, such as phosphorus (P), arsenic (As) or antimony (Sb).

The electrodes 210, 230 on the front or rear surface of the substrate 100 may be formed by, e.g., printing and baking the composition for solar cell electrodes as set forth above.

For example, a preliminary process of preparing the rear electrode may be performed by printing the composition for electrodes on the rear surface of a wafer, followed by drying at about 200° C. to about 400° C. for about 10 to 60 seconds. Further, a preliminary process for preparing the front electrode may be performed by printing the composition for electrodes on the front surface of the wafer, followed by drying the printed composition. Then, the front electrode and the rear electrode may be formed by baking the wafer or substrate with the composition for electrodes applied thereto at about 400° C. to about 950° C. or at about 750° C. to about 950° C., for about 30 to 180 seconds.

In an implementation, the electrode prepared by printing and baking the composition for solar cell electrodes as set forth above may have an aspect ratio of 0.1 to 0.3 (e.g., as calculated by the equation below). For example, the electrode may have an aspect ratio of 0.15 to 0.25. Within this range, it is possible to increase the amount of light entering the electrode per unit area, thereby further enhancing solar cell efficiency.

Aspect ratio=$D1/L3$

In the equation, D1 is the thickness of the electrode (in μm) after baking, and L3 is the line width (in μm) of the electrode after baking.

As used herein, the aspect ratio of the electrode may be measured by the following procedure: First, the composition for solar cell electrodes may be deposited over a front surface of a crystalline multi-layer wafer having a sheet resistance of 70Ω by screen printing (SUS325 printer from Microtech Co., Ltd., finger bar thickness: 15 μm/finger bar line width: 45 μm/number of finger bars: 80) in a predetermined pattern, followed by drying in an IR drying furnace. Then, an aluminum paste may be printed on a rear surface of the wafer and dried in the same manner as above. Cells formed according to this procedure may be subjected to baking at 400° C. to 900° C. for 30 to 50 seconds in a belt-type baking furnace, thereby preparing electrodes (finger bars). Thereafter, the aspect ratio of the prepared electrodes may be measured using a VK instrument (VK9710, KEYENCE Co., Ltd.).

Next, the embodiments will be described in more detail with reference to examples. However, it should be noted that these examples are provided for illustration only and should not be construed in any way as limiting the embodiments.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Examples 1 to 9 and Comparative Examples 1 to 5

Example 1

As an organic binder, 1.0 wt % of ethylcellulose (STD4, Dow Chemical Company) was sufficiently dissolved in 6.65 wt % of Texanol at 60° C., and 89.0 wt % of spherical silver powder (AG-5-11F, Dowa Hightech Co., Ltd.) having an average particle diameter of 2.0 μm, 2.5 wt % of glass frit I prepared according to the composition as listed in Table 1, below, 0.05 wt % of polydimethylsiloxane (TEGO Glide410, Evonik Co., Ltd.) (I) as an organosilane compound, 0.4 wt % of a dispersant BYK102 (BYK-Chemie), and 0.4 wt % of a thixotropic agent Thixatrol ST (Elementis Co., Ltd.) were added to the binder solution, followed by mixing and kneading in a 3-roll kneader, thereby preparing a composition for solar cell electrodes.

The prepared composition for solar cell electrodes was deposited over a front surface of a crystalline multi-layer wafer having a sheet resistance of 70Ω by screen printing (SUS325 printer from Microtech Co., Ltd./finger bar thickness: 15 μm/finger bar line width: 45 μm/number of finger bars: 80) in a predetermined pattern, followed by drying in an IR drying furnace. Then, an aluminum paste was printed on a rear surface of the wafer and dried in the same manner as above. A solar cell formed according to this procedure was subjected to baking at 400° C. to 900° C. for 30 to 50 seconds in a belt-type baking furnace and then evaluated as to the following properties. Results are shown in Table 4.

Examples 2 to 6

Solar cells were fabricated in the same manner as in Example 1 except that each composition for solar cell electrodes was prepared according to the composition as listed in Table 2, below. The fabricated solar cells were evaluated as to the following properties. Results are shown in Table 4.

Examples 7 to 8

Solar cells were fabricated in the same manner as in Example 1 except that, as the organosilane compound, hexamethyldisiloxane (TEGO Flow ATF2, Evonik Co., Ltd.) (II) was used, and each of compositions for solar cell electrodes was prepared according to the composition as listed in Table 2. The fabricated solar cells were evaluated as to the following properties. Results are shown in Table 4.

Example 9

A solar cell was fabricated in the same manner as in Example 1 except that a composition for solar cell electrodes was prepared using glass frit II in Table 1 and according to the composition in Table 2. The fabricated solar cell was evaluated as to the following properties. Results are shown in Table 4.

Comparative Examples 1 to 5

Solar cells were fabricated in the same manner as in Example 1 except that each of compositions for solar cell electrodes was prepared using glass frit in Table 1 and according to the composition in Table 3. The fabricated solar cells were evaluated as to the following properties. Results are shown in Table 5.

In Comparative Examples 2 and 3, solar cells were fabricated in the same manner as in Comparative Example 1 except that an organic acrylic compound (TEGO Flow 300, Evonik Co., Ltd) was used instead of the organosilane compound.

TABLE 1

|  | $Bi_2O_3$ | $TeO_2$ | $WO_3$ | ZnO | PbO | $Li_2O$ | $V_2O_5$ | Tg (° C.) |
|---|---|---|---|---|---|---|---|---|
| Glass frit I | 26.8 | 57.4 | 12.1 | 3.4 | — | 0.3 | — | 273° C. |
| Glass frit II | 45.9 | 47.2 | 0.2 | 6 | — | 0.7 | — | 238° C. |
| Glass frit III | 38.1 | 52.2 | — | 8.9 | — | 0.8 | — | 351° C. |
| Glass frit IV | — | — | — | 1.1 | 61.8 | 2.1 | 35 | 318° C. |

(Unit: mole %)

TABLE 2

|  |  | Example | | | | | | | | |
|---|---|---|---|---|---|---|---|---|---|---|
|  |  | 1 | 2 | 3 | 4 | 5 | 6 | 7 | 8 | 9 |
| Silver (Ag) powder |  | 89.0 | 89.0 | 89.0 | 89.0 | 89.0 | 89.0 | 89.0 | 89.0 | 89.0 |
| Glass frit | I | 2.5 | 2.5 | 2.5 | 2.5 | 2.5 | 2.5 | 2.5 | 2.5 | — |
|  | II | — | — | — | — | — | — | — | — | 2.5 |
|  | III | — | — | — | — | — | — | — | — | — |
|  | IV | — | — | — | — | — | — | — | — | — |
| Organosilane | I | 0.05 | 0.10 | 0.20 | 0.30 | 0.40 | 1.00 | — | — | 0.05 |
| compound | II | — | — | — | — | — | — | 0.10 | 0.20 | — |
| Organic | Binder | 1.0 | 1.0 | 1.0 | 1.0 | 1.0 | 1.0 | 1.0 | 1.0 | 1.0 |
| vehicle | Solvent | 6.65 | 6.60 | 6.50 | 6.40 | 6.30 | 5.70 | 6.60 | 6.50 | 6.65 |
| Additive |  | 0.8 | 0.8 | 0.8 | 0.8 | 0.8 | 0.8 | 0.8 | 0.8 | 0.8 |

(Unit: wt %)

TABLE 3

|  |  | Comparative Example | | | | |
|---|---|---|---|---|---|---|
|  |  | 1 | 2 | 3 | 4 | 5 |
| Silver (Ag) powder |  | 89.0 | 89.0 | 89.0 | 89.0 | 89.0 |
| Glass frit | I | 2.5 | 2.5 | 2.5 | — | — |
|  | II | — | — | — | 2.5 | 2.5 |
|  | III | — | — | — | — | — |
|  | IV | — | — | — | — | — |
| Organosilane | I | — | — | — | 0.05 | 0.05 |
| compound | II | — | — | — | — | — |
| Acrylic compound |  | — | 0.10 | 0.20 | — | — |
| Organic | Binder | 1.0 | 1.0 | 1.0 | 1.0 | 1.0 |
| vehicle | Solvent | 6.70 | 6.60 | 6.50 | 6.65 | 6.65 |
| Additive |  | 0.8 | 0.8 | 0.8 | 0.8 | 0.8 |

(Unit: wt %)

Evaluation of Properties

Evaluation of fine pattern: The line width and thickness of the prepared electrode lines before/after baking were measured using a VK instrument (VK9710, KEYENCE Co., Ltd.). Results are shown in Tables 4 and 5.

Measurement method of short circuit current, fill factor, and conversion efficiency: Short circuit current (ISC), fill factor (%), and conversion efficiency (%) of the solar cells were measured using a solar cell efficiency tester CT-801 (Pasan Co., Ltd.).

TABLE 4

|  | Example | | | | | | | | |
|---|---|---|---|---|---|---|---|---|---|
|  | 1 | 2 | 3 | 4 | 5 | 6 | 7 | 8 | 9 |
| Line width after printing L1 (μm) | 66.5 | 62.6 | 59.4 | 64.0 | 68.5 | 63.4 | 63.8 | 67.7 | 66.6 |
| Line width after drying L2 (μm) | 71.2 | 73.5 | 65.2 | 66.6 | 65.4 | 64.9 | 62.5 | 67.8 | 66.6 |
| Line width after baking L3 (μm) | 77.0 | 74.0 | 74.4 | 72.8 | 72.1 | 72.2 | 75.2 | 75.8 | 78.0 |
| Thickness after baking D1 (μm) | 12.2 | 12.7 | 16.3 | 15.1 | 13.7 | 13.0 | 14.8 | 13.4 | 12.9 |
| Aspect ratio (D1/L3) | 0.158 | 0.172 | 0.219 | 0.207 | 0.190 | 0.180 | 0.197 | 0.177 | 0.165 |
| Short circuit current (A) | 8.572 | 8.581 | 8.612 | 8.614 | 8.612 | 8.614 | 8.57 | 8.594 | 8.567 |
| Fill factor (%) | 0.756 | 0.757 | 0.752 | 0.752 | 0.748 | 0.753 | 0.746 | 0.758 | 0.750 |
| Conversion efficiency (%) | 16.40 | 16.43 | 16.40 | 16.39 | 16.31 | 16.41 | 16.18 | 16.50 | 16.26 |

TABLE 5

|  | Comparative Example | | | | |
|---|---|---|---|---|---|
|  | 1 | 2 | 3 | 4 | 5 |
| Line width after printing L1 (μm) | 75.2 | 68.9 | 69.5 | 70.9 | 73.7 |
| Line width after drying L2 (μm) | 77.1 | 76.4 | 76.7 | 78.9 | 79.6 |
| Line width after baking L3 (μm) | 75.3 | 82.2 | 84.7 | 81.2 | 86.6 |
| Thickness after baking D1 (μm) | 11.5 | 12.9 | 11.1 | 9.6 | 12.9 |
| Aspect ratio (D1/L3) | 0.153 | 0.157 | 0.131 | 0.118 | 0.149 |
| Short circuit current (A) | 8.531 | 8.593 | 8.568 | 8.548 | 8.564 |
| Fill factor (%) | 0.703 | 0.706 | 0.702 | 0.698 | 0.705 |
| Conversion efficiency (%) | 15.18 | 15.36 | 15.22 | 15.09 | 15.28 |

As may be seen in Tables 1, 2, and 4, the compositions for solar cell electrodes of Examples 1 to 9 including the organosilane compound and glass frits I and II having a glass transition temperature (Tg) of about 150° C. to about 300° C. allows for the preparation of an electrode having fine lines and a high aspect ratio, and the electrode may have high short circuit current (Isc) and exhibit excellent conversion efficiency and fill factor.

On the contrary, it may be seen that the electrodes prepared using the compositions for solar cell electrodes of Comparative Examples 1 to 3 (not including the organosilane compound) and the compositions for solar cell electrodes of Comparative Examples 4 to 5 (including glass frits III and IV having a glass transition temperature of higher than 300° C.) had a relatively low aspect ratio in light of the values of line width and thickness thereof measured before/after baking and exhibited relatively low short circuit current (Isc), conversion efficiency and fill factor, as compared with the electrodes prepared using the compositions for solar cell electrodes of Examples.

By way of summation and review, continuous reductions in emitter thickness for improvement of solar cell efficiency may cause shunting, which may deteriorate solar cell performance. In addition, a solar cell may be gradually increased in area to achieve high efficiency. However, efficiency may deteriorate due to increase in contact resistance of the solar cell.

In order to help improve conversion efficiency of solar cell electrodes, a composition for solar cell electrodes may have enhanced contact efficiency with respect to the wafer, thereby providing minimized contact resistance (Rc) and serial resistance (Rs), or may utilize organic materials, by which line width of a screen mask pattern may be reduced to form fine lines, thereby increasing short circuit current (Isc). However, decreasing the line width of electrodes using the screen mask may cause an increase in serial resistance (Rs) and deterioration in continuous printability of fine patterns.

The embodiments may provide a composition for solar cell electrodes that facilitates preparation of an electrode having fine lines and high aspect ratio.

The embodiments may provide a composition for solar cell electrodes that helps minimize serial resistance and enhance open circuit voltage.

The embodiments may provide a solar cell electrode that has increased short circuit current (Isc), thereby providing excellent conversion efficiency and fill factor.

The composition for solar cell electrodes according to an embodiment may include an organosilane compound to facilitate preparation of an electrode having fine lines and a high aspect ratio. In addition, a solar cell electrode fabricated using the composition may have high short circuit current (Isc) and low serial resistance (Rs) and may exhibit excellent conversion efficiency and fill factor.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for solar cell electrodes, the composition comprising:
about 60 wt % to about 95 wt % of silver powder;
about 0.1 wt % to about 20 wt % of a glass frit that contains tellurium, the glass frit having a glass transition temperature (Tg) of about 150° C. to about 300° C.;
about 0.01 wt % to about 3 wt % of an organosilane compound; and
about 1 wt % to about 30 wt % of an organic vehicle.

2. The composition as claimed in claim 1, wherein the glass frit is a Bi—Te—O-containing glass frit and contains about 50 mole % to about 90 mole % of elemental tellurium (Te).

3. The composition as claimed in claim 2, wherein, in the Bi—Te—O-containing glass frit, a mole ratio of bismuth (Bi) to tellurium (Te) is about 1:1.5 to about 1:3.5.

4. The composition as claimed in claim 2, wherein the Bi—Te—O-containing glass frit further includes lithium (Li), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), or aluminum (Al).

5. The composition as claimed in claim 2, wherein the glass frit contains about 5 mole % to about 20 mole % of elemental bismuth (Bi).

6. The composition as claimed in claim 1, wherein the glass frit is a lead-free glass frit.

7. The composition as claimed in claim 1, wherein the organosilane compound includes a siloxane compound represented by the following Formula 1:

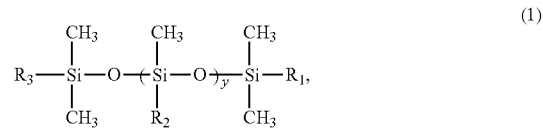

wherein, in Formula 1, $R_1$ to $R_3$ are each independently a $C_1$ to $C_6$ alkyl group, an ether group, an amino group, a hydroxyl group, a fluoroalkyl group, a phenyl group, an epoxy group, or a carboxyl group, and y is an integer from 0 to 3,000.

8. The composition as claimed in claim 7, wherein the glass frit and the organosilane compound are included in the composition in a weight ratio of about 1:0.005 to about 1:30.

9. The composition as claimed in claim 1, wherein the glass frit has an average particle diameter (D50) of about 0.1 μm to about 10 μm.

10. The composition as claimed in claim 1, further comprising a thixotropic agent, a viscosity stabilizer, an antifoaming agent, a pigment, a UV stabilizer, an antioxidant, or a coupling agent.

11. A solar cell electrode prepared from the composition for solar cell electrodes as claimed in claim 1.

12. The solar cell electrode as claimed in claim 11, wherein the solar cell electrode has an aspect ratio of about 0.1 to about 0.3, as represented by the following equation:

Aspect ratio=$D1/L3$ wherein D1 is a thickness in μm of the electrode after baking and L3 is a line width in of the electrode after baking.

* * * * *